(12) United States Patent
Doyle

(10) Patent No.: US 8,198,892 B2
(45) Date of Patent: Jun. 12, 2012

(54) STEADY-STATE-FREE-PRECESSION (SSFP) MAGNETIC RESONANCE IMAGING (MRI) AND METHOD

(75) Inventor: Mark Doyle, Wexford, PA (US)

(73) Assignee: Allegheny-Singer Research Institute, Pittsburgh, PA (US)

(*) Notice: Subject to any disclaimer, the term of this patent is extended or adjusted under 35 U.S.C. 154(b) by 327 days.

(21) Appl. No.: 12/386,751

(22) Filed: Apr. 22, 2009

(65) Prior Publication Data
US 2010/0271020 A1 Oct. 28, 2010

(51) Int. Cl.
*G01V 3/00* (2006.01)
(52) U.S. Cl. .................................................. 324/309
(58) Field of Classification Search .......... 324/300–322; 600/410–435
See application file for complete search history.

(56) References Cited

U.S. PATENT DOCUMENTS

| | | |
|---|---|---|
| 4,310,799 A | 1/1982 | Hutchison et al. |
| 4,727,327 A | 2/1988 | Toyoshima et al. |
| 4,829,252 A | 5/1989 | Kaufman |
| 4,973,906 A | 11/1990 | Bernstein |
| 5,034,692 A | 7/1991 | Laub et al. |
| 5,160,889 A | 11/1992 | Scheidegger et al. |
| 5,204,627 A | 4/1993 | Mistretta et al. |
| 5,305,749 A | 4/1994 | Li et al. |
| 5,347,218 A * | 9/1994 | Van Yperen ................. 324/309 |
| 5,417,213 A | 5/1995 | Prince |
| 5,525,904 A | 6/1996 | Hanley et al. |
| 5,668,474 A | 9/1997 | Heid |
| 5,713,358 A | 2/1998 | Mistretta et al. |
| 5,910,728 A | 6/1999 | Sodickson |
| 6,088,611 A | 7/2000 | Lauterbur et al. |
| 6,233,475 B1 | 5/2001 | Kim et al. |
| 6,259,940 B1 | 7/2001 | Bernstein et al. |
| 6,275,037 B1 | 8/2001 | Harvey et al. |
| 6,307,368 B1 | 10/2001 | Vasanawala et al. |

(Continued)

FOREIGN PATENT DOCUMENTS

EP 0430104 A2 6/1991

(Continued)

OTHER PUBLICATIONS

Doyle et al. "Block Regional Interpolation Scheme for K-Space (BRISK): A Rapid Cardiac Imaging Technique" 1995, Magnetic Resonance in Medicine, Academic Press (Duluth, MN, US) 33:163-170.

(Continued)

*Primary Examiner* — Dixomara Vargas
(74) *Attorney, Agent, or Firm* — Fox Rothschild LLP

(57) ABSTRACT

An MRI includes imaging coils. The MRI includes receiving coils. The MRI includes a controller causing the imaging coils to produce RF pulses at every repetition time so different parts of a patient are receiving excitation by RF pulses at different rates and k space data are acquired at each repetition time by the receiving coils to form images of the patient with the k space data. A method for an MRI includes the steps of causing with a controller imaging coils to produce RF pulses at every repetition time so different parts of a patient are receiving excitation by RF pulses at different rates. There is the step of acquiring k space data at each repetition time by receiving coils. There is the step of forming images of the patient with the k space data using approaches such as Fourier transformation or filtered back projection.

14 Claims, 8 Drawing Sheets

U.S. PATENT DOCUMENTS

| | | |
|---|---|---|
| 6,310,478 B1 | 10/2001 | Heid |
| 6,487,435 B2 | 11/2002 | Mistretta et al. |
| 6,630,828 B1 | 10/2003 | Mistretta et al. |
| 6,771,067 B2 | 8/2004 | Kellman et al. |
| 6,794,867 B1 | 9/2004 | Block et al. |
| 6,975,115 B1 | 12/2005 | Fujita et al. |
| 7,005,853 B2 | 2/2006 | Tsao et al. |
| 7,020,509 B2 | 3/2006 | Heid |
| 7,023,207 B1 | 4/2006 | Gaddipati et al. |
| 7,202,663 B2 | 4/2007 | Huang |
| 7,245,125 B2 | 7/2007 | Harer et al. |
| 7,253,620 B1 | 8/2007 | Derbyshire et al. |
| 7,486,074 B2 | 2/2009 | McKenzie et al. |
| 7,541,808 B2 | 6/2009 | Doyle |
| 7,683,614 B2 | 3/2010 | Posse |
| 7,693,563 B2 | 4/2010 | Suresh et al. |
| 2003/0166999 A1 | 9/2003 | Liu et al. |
| 2003/0169043 A1 | 9/2003 | Hoshino |
| 2004/0051529 A1 | 3/2004 | Zhu et al. |
| 2004/0254447 A1 | 12/2004 | Block et al. |
| 2005/0007112 A1 | 1/2005 | Deimling |
| 2005/0251023 A1 | 11/2005 | Kannengiesser et al. |
| 2006/0036154 A1 | 2/2006 | Deimling |
| 2006/0050981 A1 | 3/2006 | Huang |
| 2007/0063701 A1 | 3/2007 | Vu |
| 2007/0110290 A1 | 5/2007 | Chang et al. |
| 2007/0159174 A1 | 7/2007 | Oshio |
| 2007/0242866 A1 | 10/2007 | Schmitt et al. |
| 2008/0021304 A1 | 1/2008 | Stemmer |
| 2008/0175458 A1 | 7/2008 | Guo et al. |
| 2009/0105582 A1 | 4/2009 | Dougherty et al. |
| 2009/0134871 A1* | 5/2009 | Yui ............................ 324/309 |

FOREIGN PATENT DOCUMENTS

| | | |
|---|---|---|
| EP | 0924530 A2 | 6/1999 |
| GB | 2034123 A | 5/1980 |
| JP | 06 237910 A | 8/1994 |
| WO | WO 90/02344 | 3/1990 |
| WO | WO 90/12329 | 10/1990 |
| WO | WO 91/13367 A1 | 9/1991 |
| WO | WO 94/29741 A1 | 12/1994 |
| WO | WO 2006/120583 A | 11/2006 |

OTHER PUBLICATIONS

Geier et al. "Parallel Acquisition for Effective Density Weighted Imaging: PLANED Imaging" 2007, Magnetic Resonance Materials in Physics, Biology and Medicine, Chapman and Hall (London, GB) 20(1);19-25).

Kozerke et al. "Accelerating Cardiac Cine 3D Imaging Using k-t BLAST" 2004, Magnetic Resonance in Medicine, Wiley-Liss, Inc 52:19-26.

Lethmate et al. "Dynamic MR-Imaging with Radial Scanning, a Post-Acquisition Keyhole Approach" 2003, EURASIP J. on app. Signal Processing, Hindawi Publishing Corp. p. 405-412.

Pipe "Reconstructing MR Images From Undersampled Data: Data-Weighting Considerations" 2000, Magnetic Resonance in Medicine, Academic Press (Duluth, MN, US) 43(6):867-875.

Rehwald et al. "Theory of High-Speed MR Imaging o the Human Heart with the Selective Line Acquisition Mode" 2001, Radiology 220(2):540-547.

Tsai et al. "Reduced Aliasing Artifacts using Variable-Density k-Space Sampling Trajectories" 2000, Magnetic Resonance in Medicine, Academic Press (Duluth, MN, US) 43(3):452-458.

Tsao et al. "Eight-fold acceleration in real-time cardiac imaging using k-t BLASTand k-t SENSE with SSFP and segmented EPI" 2003, Proc, Intl. soc. Mag. Reson. Med. 11:209.

Tsao et al. "k-t BLAST and k-t SENSE: Dynamic MRI With High Frame Rate Exploiting Spatiotemporal Correlations" 2003, Magnetic Resonance in Medicine, Wiley-Liss, Inc. 50(5):1031-1042.

Goldfarb "Targeted Rotational Magnetic Resonance Angiography (TROTA): 2D Projection Imaging with 3D Reconstruction" 2004, Proceedings of the International Society for Magnetic Resonance in Medicine, 12th Scientific Meeting and Exhibition (Kyoto, JP) 11:2109.

Gurr et al. "Polar Phase Encode Placement for 3D Acquisition with time-resolved projections" 2003, Proceedings of the International Society for Magnetic Resonance in Medicine, 11th Scientific Meeting and Exhibition (Toronto, Canada 11:1349.

Lin et al. "Blood Attenuation with SSFP-Compatible Saturation (BASS)" 2006, Journal of Magnetic Resonance Imaging, Society for Magnetic Resonance Imaging (Oak Brook, IL, US) 24:701-707.

Uribe et al. "Integration of Magnetization Preparation Sequences into SSFP Sequences: A Fat Saturation Example" 2008, Proceedings of the International Society for Magnetic Resonance in Medicine, 16th Scientific Meeting and Exhibition (Toronto, Canada) p. 1402.

Werner at al. "Continuous Artery-Selective Spin Labeling (CASSL)" 2005, Magnetic Resonance in Medicine, Academic Press (Duluth, MN, US) 53:1006-1012.

Herzka et al. "Mycocardial tagging with SSFP" 2003, Magnetic Resonance in Medicine, Academic Press (Duluth, MN, US) 49:329-340 (XP002548177).

Herzka et al. "Multishot EPI-SSFP in the Heart" 2002, Magnetic Resonance in Medicine, Academic Press (Duluth, MN, US) 47(4):655-664 (XP002526274).

Pai "PTAGs: Partial k-space tagging combined with SSFP" 2006, Proceedings of the Int'l Society for Magnetic Resonance in Medicine, 14th Scientific Meeting and Exhibition (Seattle, WA, US) p. 1216 (XP002548176).

Stainsby et al. "Visualizing flow using MR tagging and FIESTA Imaging" 2005, Proceedings of the Int'l Society for Magnetic Resonance in Medicine, 13th Scientific Meeting and Exhibition (Miami Beach, FL, US) p. 2382 (XP002548178).

Witschey et al. "Balanced steady-state free precession spatial gridding" 2008, Proceedings of the Int'l Society for Magnetic Resonance in Medicine, 16th Scientific Meeting and Exhibition (Toronto, Canada) p. 1404 (XP002548175).

Griswold et al. "Autocalibrated coil sensitivity estimation for parallel imaging" 2006, NMR in Biomedicine, Wiley (London, GB) 19:316-324.

Kellman et al. "Adaptive Sensitivity Encoding Incorporating Temporal Filtering (TSENSE)" 2001, Magnetic Resonance in Medicine, Academic Press (Duluth, MN, US) 45(5):846-852.

Madore et al. "Unaliasing by Fourier-Encoding *The Overlaps Using the Temporal Dimension (UNFOLD), Applied to Cardiac Imaging and FMRI*" Magnetic Resonance in Medicine, Academic Press (Duluth, MN, US) 42:813-828.

Song et al. "Dynamic MRI with projection reconstruction and KWIC processing for simultaneous high spatial and temporal resolution" 2004, Magnetic Resonance in Medicine, Academic Press (Duluth, MN, US) 52(4):815-824.

Maier et al. "Accurate Velocity Mapping with FAcE" 1996, Magnetic Resonance Imaging, Elsevier Science, Inc. (USA) 14(2):163-171.

* cited by examiner

```
OXOXOXOX
XOXOXOXO
OXOXOXOX
XOXOXOXO
```

REGION OF LOW BLOOD SIGNAL
AGAINST THE BRIGHT BACKGROUND

SIGNAL LOSS BAND DUE
TO SUSCEPTIBILITY

STEADY-STATE-FREE-PRECESSION (SSFP) MAGNETIC RESONANCE IMAGING (MRI) AND METHOD

FIELD OF THE INVENTION

The present invention is related to an MRI which produces RF pulses at every repetition time so different parts of a patient are receiving excitation by RF pulses at different rates so k space data are acquired at each repetition time to form images of the patient. (As used herein, references to the "present invention" or "invention" relate to exemplary embodiments and not necessarily to every embodiment encompassed by the appended claims.) More specifically, the present invention is related to an MRI which produces RF pulses at every repetition time so different parts of a patient are receiving excitation by RF pulses at different rates so k space data are acquired at each repetition time to form images of the patient wherein spins that are targeted to be imaged by the imaging coils are excited by an RF pulse at an interval of one repetition time, while spins that are to be suppressed are excited at an interval of at least two repetition times.

BACKGROUND OF THE INVENTION

This section is intended to introduce the reader to various aspects of the art that may be related to various aspects of the present invention. The following discussion is intended to provide information to facilitate a better understanding of the present invention. Accordingly, it should be understood that statements in the following discussion are to be read in this light, and not as admissions of prior art.

The present invention describes an approach to eliminate or suppress signals from physical regions such that the magnetic resonance images formed by the process will experience regions of signal loss applied in a controlled manner. Selective elimination of signal is beneficial in several areas, including allowing inner volume imaging in 2D and 3D data sets, suppressing signal along an arbitrary line intersecting the imaged plane to allow direct visualization of flowing blood, and to efficiently obtain black-blood cine images. The technique is termed Elimination of Regionally Acquired Signal using Echo Refocusing: ERASER. The underlying imaging approach used is steady-state-free-precession (SSFP) magnetic resonance imaging (MRI). In SSFP imaging, a high steady state signal is established and maintained by applying radio frequency (RF) pulses in a repetitive manner, over a time scale much shorter than the relaxation time of the spin system. For imaging sequences using SSFP the imaging gradients are applied in a manner such that their area balances to zero over each TR period. Any residual gradients, either applied as part of the imaging sequence, or gradients that are present due to inhomogeneities of the main magnetic field, will dephase the spin system in a spatially dependant manner, and conventionally, great care is taken to eliminate such residual field gradients. When the spins are dephased by close to 90 degrees from their ideal phase of zero degrees, the spins will not refocus when the RF pulses are repetitively applied at the TR interval. Typically, these spins are present as artifacts in conventional images, and typically the region of signal loss is limited to a relatively thin line or set of lines (FIG. 1). FIG. 1 shows that regions of signal loss occur as a consequence of main magnetic field inhomogeneities, and typically manifest as curved lines of low or zero signal. Typically, these low signal regions are confined to the outer regions of the body. However, different inhomogeneity patterns can produce wider bands of signal loss (FIG. 2). FIG. 2 shows that when deliberately introducing a focal magnetic field inhomogeneity (in this case by introducing a static steel paper clip into the imaging field) a strong pattern of alternating dark and bright signal regions can be seen. In this case the inhomogeneity gradient is non-linear, leading to non-linear spacing of the bright and dark bands, but where the gradient approximates to a linear region, the width of the bright and dark bands are approximately equal. In ERASER, conditions are arranged to bring this phenomena under control, and to enhance its effectiveness to preferentially diminish or eliminate signals from targeted spatial regions in the image.

The closest known technology is missing pulse SSFP (MP-SSFP) imaging. In the MP-SSFP approach, intersecting spatially selective slices and slabs are proposed. However, signal is not acquired immediately following application of each RF pulse, rather, signal is acquired during the period when a subsequent "missing pulse" would normally be applied, i.e. if two intersecting spatial regions were applied, the signal originating only from the intersecting region would be acquired at the time of the (missing) third RF pulse. Thus, at a minimum, signal is only acquired every third TR period, and at longer intervals if a higher number of intersecting pulses are used. Further. MP-SSFP does not require application of a spin-dephasing gradient.

BRIEF SUMMARY OF THE INVENTION

The present invention pertains to a steady-state-free-precession (SSFP) magnetic resonance imaging (MRI). The MRI comprises imaging coils. The MRI comprises receiving coils. The MRI comprises a controller causing the imaging coils to produce RF pulses at every repetition time so different parts of a patient are receiving excitation by RF pulses at different rates and k space data are acquired at each repetition time by the receiving coils to form images of the patient with the k space data.

The present invention pertains to a method for a steady-state-free-precession (SSFP) magnetic resonance imaging (MRI). The method comprises the steps of causing with a controller imaging coils to produce RF pulses at every repetition time so different parts of a patient are receiving excitation by RF pulses at different rates. There is the step of acquiring k space data at each repetition time by receiving coils. There is the step of forming images of the patient with the k space data using approaches such as Fourier transformation or filtered back projection.

The present invention pertains to a method for a steady-state-free-precession (SSFP) magnetic resonance imaging (MRI). The method comprises the steps of causing with a controller imaging coils to produce RF pulses at every repetition time so different parts of a patient are receiving excitation by RF pulses at different rates and a targeted body region which could be remote from the surface of the patient. There is the step of acquiring k space data at each repetition time by receiving coils. There is the step of forming images of the patient with the k space data using approaches such as Fourier transformation or filtered back projection.

The present invention pertains to a method for a steady-state-free-precession (SSFP) magnetic resonance imaging (MRI). The method comprises the steps of causing with a controller imaging coils to produce RF pulses at every repetition time so different parts of a patient are receiving excitation by RF pulses at different rates and a targeted plane of the body of the patient which could be remote from the surface of the patient. There is the step of acquiring k space data at each repetition time by receiving coils. There is the step of forming images of the patient with the k space data using approaches such as Fourier transformation or filtered back projection.

The present invention pertains to a method for a steady-state-free-precession (SSFP) magnetic resonance imaging (MRI). The method comprises the steps of causing with a controller imaging coils to produce RF pulses at every repetition time so different parts of a patient are receiving excitation by RF pulses at different rates and a region of flow is targeted in the patient. There is the step of acquiring k space data at each repetition time by receiving. There is the step of forming images of the patient with the k space data using approaches such as Fourier transformation or filtered back projection.

The present invention pertains to a method for a steady-state-free-precession (SSFP) magnetic resonance imaging (MRI). The method comprises the steps of causing with a controller imaging coils to produce RF pulses at every repetition time so different parts of a patient are receiving excitation by RF pulses at different rates and any contribution from moving blood is removed. There is the step of acquiring k space data at each repetition time by receiving coils. There is the step of forming images of the patient with the k space data using approaches such as Fourier transformation or filtered back projection.

The present invention pertains to a steady-state-free-precession (SSFP) magnetic resonance imaging (MRI). The MRI comprises imaging coils. The MRI comprises receiving coils. The MRI comprises a controller causing the imaging coils to produce RF pulses at every repetition time so different parts of a patient are receiving excitation by RF pulses at different rates to produce RF pulses at every repetition time so different parts of a patient are receiving excitation by RF pulses at different rates and a targeted body region is remote from the surface of the patient and k space data are acquired at each repetition time by the receiving coils to form images of the patient.

The present invention pertains to a steady-state-free-precession (SSFP) magnetic resonance imaging (MRI). The MRI comprises imaging coils. The MRI comprises receiving coils. The MRI comprises a controller causing the imaging coils to produce RF pulses at every repetition time so different parts of a patient are receiving excitation by RF pulses at different rates and a targeted plane of the body of the patient is remote from the surface of the patient, and k space data are acquired at each repetition time by the receiving coils to form images of the patient.

The present invention pertains to a steady-state-free-precession (SSFP) magnetic resonance imaging (MRI). The MRI comprises imaging coils. The MRI comprises receiving coils. The MRI comprises a controller causing the imaging coils to produce RF pulses at every repetition time so different parts of a patient are receiving excitation by RF pulses at different rates and a region of flow is targeted in the patient, and k space data are acquired at each repetition time by the receiving coils to form images of the patient.

The present invention pertains to a steady-state-free-precession (SSFP) magnetic resonance imaging (MRI). The MRI comprises imaging coils. The MRI comprises receiving coils. The MRI comprises a controller causing the imaging coils to produce RF pulses at every repetition time so different parts of a patient are receiving excitation by RF pulses at different rates and any contribution from moving blood is removed, and k space data are acquired at each repetition time by the receiving coils to form images of the patient.

BRIEF DESCRIPTION OF THE SEVERAL VIEWS OF THE DRAWING

In the accompanying drawings, the preferred embodiment of the invention and preferred methods of practicing the invention are illustrated in which.

DETAILED DESCRIPTION OF THE INVENTION

Figure 15:
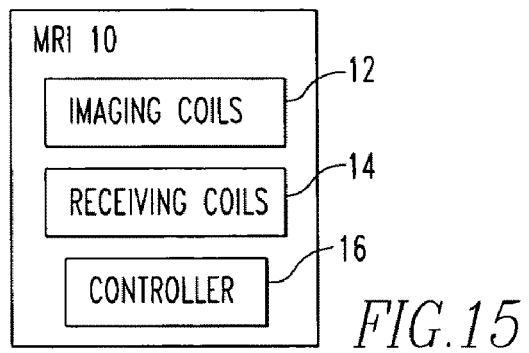
FIG. 15 is a block diagram of the MRI of the present invention.

Referring now to the drawings wherein like reference numerals refer to similar or identical parts throughout the several views, and more specifically to FIG. 15 thereof, there is shown a steady-state-free-precession (SSFP) magnetic resonance imaging (MRI) 10. The MRI 10 comprises imaging coils 12. The MRI 10 comprises receiving coils 14. The MRI 10 comprises a controller 16 causing the imaging coils 12 to produce RF pulses at every repetition time so different parts of a patient are receiving excitation by RF pulses at different rates and k space data are acquired at each repetition time by the receiving coils 14 to form images of the patient with the k space data.

Spins that are targeted to be imaged by the imaging coils 12 may be excited by an RF pulse at an interval of one repetition time, while spins that are to be suppressed may be excited at an interval of at least two repetition times.

The controller 16 may cause the imaging coils 12 to apply at least two spatially separate RF pulses to the patient. Where two spatially selective regions intersect, the spins may receive successive excitations at an interval of one repetition time, while spatial regions that do not intersect may receive RF pulses at an interval of two repetition times.

The controller 16 may cause the imaging coils 12 to introduce a targeted inhomogeneity of a magnetic field such that spins that experience a two repetition time excitation dephase by close to 90° do not contribute to the signal received by the receiving coils 14 for the data, while spins that experience a one repetition time interval may experience a lesser dephase angle and the spins that experience the one repetition time interval may contribute a signal to the receiving coils 14 for data.

Over an extended time of two repetition times, the field inhomogeneity may sufficiently dephase spins such that the dephase spins do not contribute to the signal, while over a one repetition time interval, the field inhomogeneity essentially may not dephase the spins and the dephased spins in the one repetition time interval may contribute to subsequent signals.

The present invention pertains to a method for a steady-state-free-precession (SSFP) magnetic resonance imaging (MRI) 10. The method comprises the steps of causing with a controller 16 imaging coils 12 to produce RF pulses at every repetition time so different parts of a patient are receiving excitation by RF pulses at different rates. There is the step of acquiring k space data at each repetition time by receiving coils 14. There is the step of forming images of the patient with the k space data using approaches such as Fourier transformation or filtered back projection.

There can be the step of exciting by an RF pulse at an interval of one repetition time from the imaging coils 12 spins that are targeted to be imaged by the imaging coils 12, and exciting by an RF pulse at an interval of at least two repetition times spins that are to be suppressed. There can be the step of the controller 16 causing the imaging coils 12 to apply at least two spatially separate RF pulses to the patient.

Where two spatially selective regions intersect, there can be the step of the spins receiving successive excitations at an interval of one repetition time, and wherein where two spatially selective regions do not intersect there can be the step of the spins receiving RF pulses at an interval of two repetition times.

There can be the step of the controller 16 causing the imaging coils 12 to introduce a targeted inhomogeneity of a magnetic field such that spins that experience a two repetition time excitation dephase by close to 90° do not contribute to a signal received by the receiving coils 14 for the data, while spins that experience a one repetition time interval experience a lesser dephase angle and the spins that experience the one repetition time interval contribute a signal to the receiving coils 14 for data. Over an extended time of two repetition times, there can be the step of the field inhomogeneity sufficiently dephasing spans such that the dephase spins do not contribute to the signal, while over a one repetition time interval, there can be the step of the field inhomogeneity essentially not dephasing the spins and the dephased spins in the one repetition time interval contribute to subsequent signals.

The present invention pertains to a method for a steady-state-free-precession (SSFP) magnetic resonance imaging (MRI) 10. The method comprises the steps of causing with a controller 16 imaging coils 12 to produce RF pulses at every repetition time so different parts of a patient are receiving excitation by RF pulses at different rates and a targeted body region which could be remote from the surface of the patient. There is the step of acquiring k space data at each repetition time by receiving coils 14. There is the step of forming images of the patient with the k space data using approaches such as Fourier transformation or filtered back projection.

The present invention pertains to a method for a steady-state-free-precession (SSFP) magnetic resonance imaging (MRI) 10. The method comprises the steps of causing with a controller 16 imaging coils 12 to produce RF pulses at every repetition time so different parts of a patient are receiving excitation by RF pulses at different rates and a targeted plane of the body of the patient which could be remote from the surface of the patient. There is the step of acquiring k space data at each repetition time by receiving coils 14. There is the step of forming images of the patient with the k space data using approaches such as Fourier transformation or filtered back projection.

The present invention pertains to a method for a steady-state-free-precession (SSFP) magnetic resonance imaging (MRI) 10. The method comprises the steps of causing with a controller 16 imaging coils 12 to produce RF pulses at every repetition time so different parts of a patient are receiving excitation by RF pulses at different rates and a region of flow is targeted in the patient. There is the step of acquiring k space data at each repetition time by receiving. There is the step of forming images of the patient with the k space data using approaches such as Fourier transformation or filtered back projection.

The present invention pertains to a method for a steady-state-free-precession (SSFP) magnetic resonance imaging (MRI) 10. The method comprises the steps of causing with a controller 16 imaging coils 12 to produce RF pulses at every repetition time so different parts of a patient are receiving excitation by RF pulses at different rates and any contribution from moving blood is removed. There is the step of acquiring k space data at each repetition time by receiving coils 14. There is the step of forming images of the patient with the k space data using approaches such as Fourier transformation or filtered back projection.

The present invention pertains to a steady-state-free-precession (SSFP) magnetic resonance imaging (MRI) 10. The MRI 10 comprises imaging coils 12. The MRI 10 comprises receiving coils 14. The MRI 10 comprises a controller 16 causing the imaging coils 12 to produce RF pulses at every repetition time so different parts of a patient are receiving excitation by RF pulses at different rates to produce RF pulses at every repetition time so different parts of a patient are receiving excitation by RF pulses at different rates and a targeted body region is remote from the surface of the patient and k space data are acquired at each repetition time by the receiving coils 14 to form images of the patient.

The present invention pertains to a steady-state-free-precession (SSFP) magnetic resonance imaging (MRI) 10. The MRI 10 comprises imaging coils 12. The MRI 10 comprises receiving coils 14. The MRI 10 comprises a controller 16 causing the imaging coils 12 to produce RF pulses at every repetition time so different parts of a patient are receiving excitation by RF pulses at different rates and a targeted plane of the body of the patient is remote from the surface of the patient, and k space data are acquired at each repetition time by the receiving coils 14 to form images of the patient.

The present invention pertains to a steady-state-free-precession (SSFP) magnetic resonance imaging (MRI) 10. The MRI 10 comprises imaging coils 12. The MRI 10 comprises receiving coils 14. The MRI 10 comprises a controller 16 causing the imaging coils 12 to produce RF pulses at every repetition time so different parts of a patient are receiving excitation by RF pulses at different rates and a region of flow is targeted in the patient, and k space data are acquired at each repetition time by the receiving coils 14 to form images of the patient.

The present invention pertains to a steady-state-free-precession (SSFP) magnetic resonance imaging (MRI) 10. The MRI 10 comprises imaging coils 12. The MRI 10 comprises receiving coils 14. The MRI 10 comprises a controller 16 causing the imaging coils 12 to produce RF pulses at every repetition time so different parts of a patient are receiving excitation by RF pulses at different rates and any contribution from moving blood is removed, and k space data are acquired at each repetition time by the receiving coils 14 to form images of the patient.

In the operation of the invention, in ERASER, the spins that are targeted to be imaged are excited by an RF pulse at an interval of 1TR (1 time of repetition), while spins that are to be suppressed are excited at an interval of 2TR (or even higher multiples of TR). To accomplish this, at least two spatially separate RF pulses are applied. Where the two spatially selective regions intersect, the spins receive successive excitations at an interval of 1TR, while spatial regions that do not intersect receive RF pulses at an interval of 2TR. In conjunction with this spin excitation strategy, a targeted inhomogeneity of the field is introduced such that spins that experience a 2TR excitation dephase by close to 90 degrees and will thus not contribute further to the signal, while spins that experience a 1TR interval, will have experienced a lesser dephase angle (due to being only subjected to the inhomogeneity for a shorter time before the RF pulse effectively "resets" the spins) and these targeted spins will contribute a strong signal. The main principle (claim) then is that over the extended time of 2TR, a low level of field inhomogeneity can sufficiently dephase spins such that they do not contribute further, while over a 1TR interval, the same level of inhomogeneity is not sufficient to dephase the spins by a large amount, and they will contribute to subsequent signals.

Several specific examples of the use of this approach are described, two means of producing the targeted inhomogeneity and several variants on image data encoding are described; however, these specific embodiments are not to be considered exhaustive.

3D Inner Volume Imaging

Figure 1:
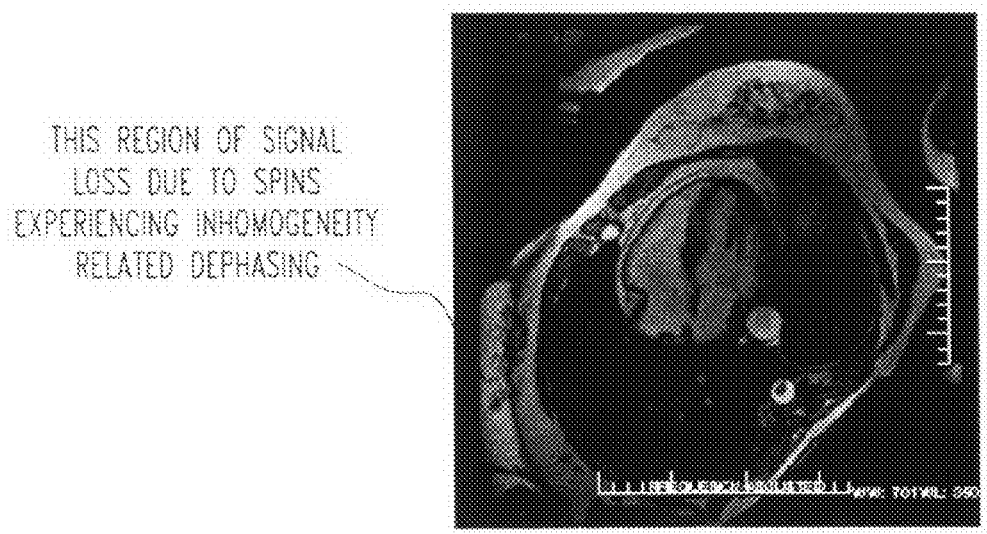
FIG. 1 shows regions of signal loss occur as a consequence of main magnetic field inhomogeneities, and typically manifest as curved lines of low or zero signal.
Figure 2:
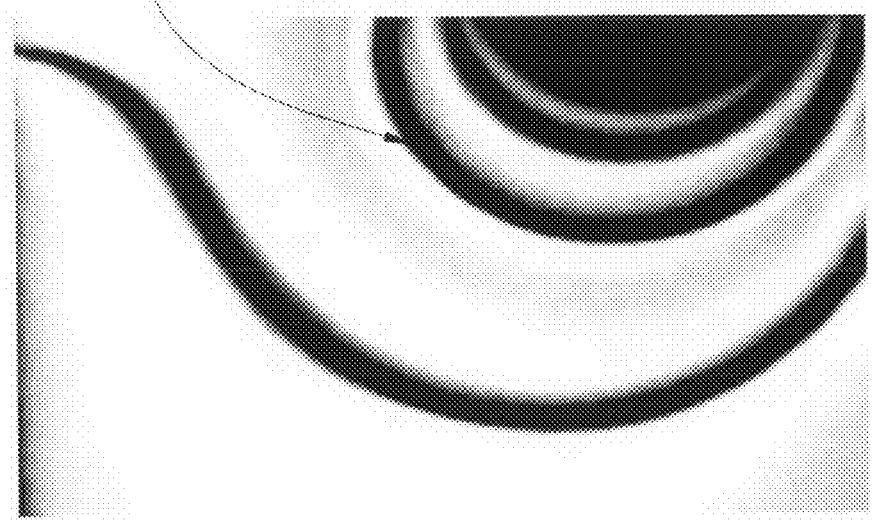
FIG. 2 shows when deliberately introducing a focal magnetic field inhomogeneity (in this case by introducing a static steel paper clip into the imaging field) a strong pattern of alternating dark and bright signal regions can be seen.
Figure 3:
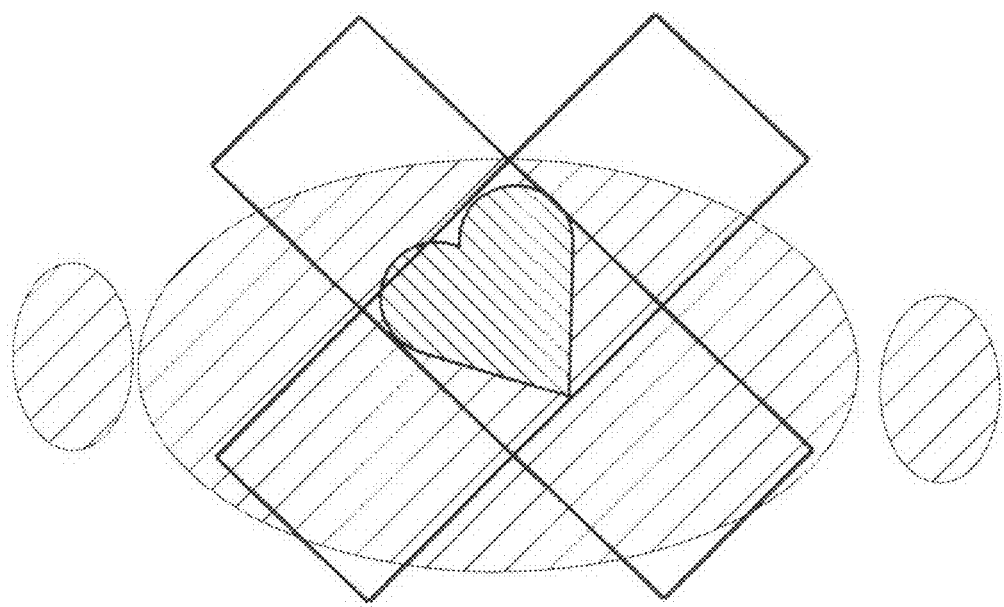
FIG. 3 shows, in this example, two overlapping excitation slabs are applied such that they intersect over the target region (over the heart).
Figure 4:
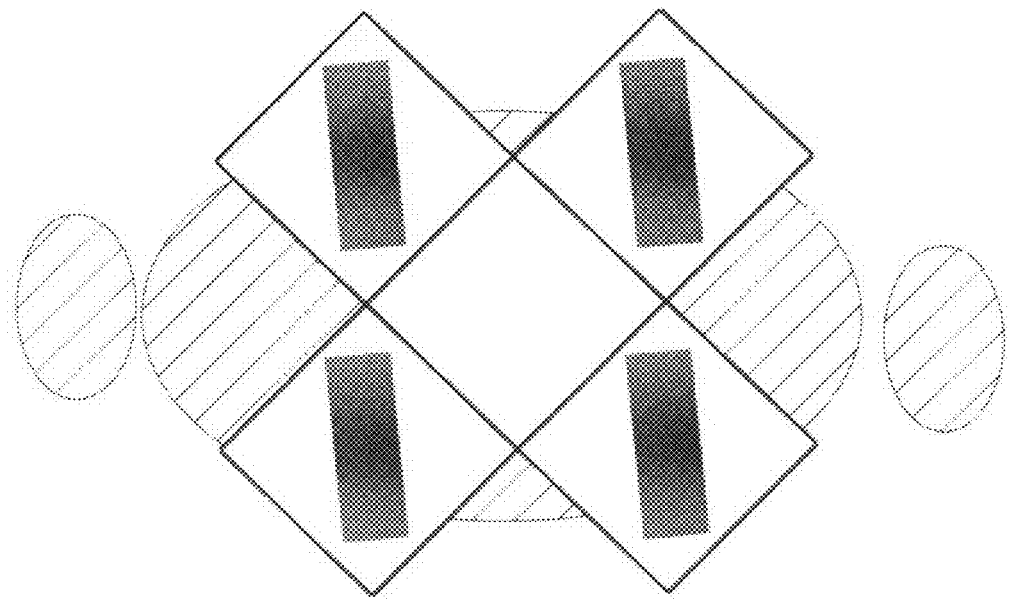
FIG. 4 shows for the slab excitation example of FIG. 3, the dephasing gradient is applied at 45 degrees to each slab, with intensity and duration such that a low signal band extends diagonally over each outer square region.

Typically, in MRI 10 applications such as cardiac imaging, the target body region is remote from the surface of the body. In these cases, inner volume imaging is desirable to avoid the excessive scan times required in additionally imaging the surrounding body structures. FIG. 3 shows, in this example, two overlapping excitation slabs are applied such that they intersect over the target region (over the heart). The angle of the slabs is arranged such that the widest parts of the body, containing the arms in this case, are avoided by each. In this example, the outer regions are represented as squares (in this cross-sectional view) each of equal size to the central target region. Each slab is shown here in cross-section, with the long direction of the volume of interest extending from the "head to feet" direction. In FIG. 3 two intersecting slab excitations are illustrated, in this case intersecting at 90 degrees to each other. The cross-section shown represents the dimensions that are to be phase encoded, with the read direction directed orthogonal to the plane of the illustration (i.e. along the head-feet direction of the body). In this illustration, the two slabs intersect over the heart region, which receives an excitation RF pulse at a 1TR interval, while the outer regions experience excitation pulses at 2TR intervals. During the excitation of slab #1, signal is received from the whole of slab #1 only, and during excitation of slab #2, signal is received from the whole of slab #2 only. Unless a dephasing field is applied, the signal from the non-intersecting regions of each slab will contribute a similar signal level compared to the intersecting region. In ERASER, a small perturbation to the main magnetic field is applied over the multiple TR periods over which imaging data are acquired. In scenario 1, a low level gradient is applied by using the imaging gradients of the system. The product of the gradient strength and the spin evolution time between RF pulses determines the dephasing angle of the spins. Thus, the spins in the non-intersecting regions dephase by twice the amount compared to the spins in the intersecting region. FIG. 4 shows for the slab excitation example of FIG. 3, the dephasing gradient is applied at 45 degrees to each slab, with intensity and duration such that a low signal band extends diagonally over each outer square region. In FIG. 4, the constant, low-level gradient was applied at 45 degrees to the imaging slabs, and results in half of the width of the outer regions contributing a low or zero level signal. The reason why only half of the spins are dephased is due to the dephasing range being double that of the intersecting spins, which necessarily are dephased only partially, and thus contribute a bright signal, it then follows that the outer regions, which contain twice the dephasing level, will contribute signal from those spins within the same phase range as the intersecting spins (approximately half of the spins), while the other half are arranged to be predominantly in the dephased condition. As presented here, the linearly applied gradient will alter the signal amplitude in a sinusoidal manner, thus the bright and dark signal intensities should be understood in these terms.

Figures 5, 6:
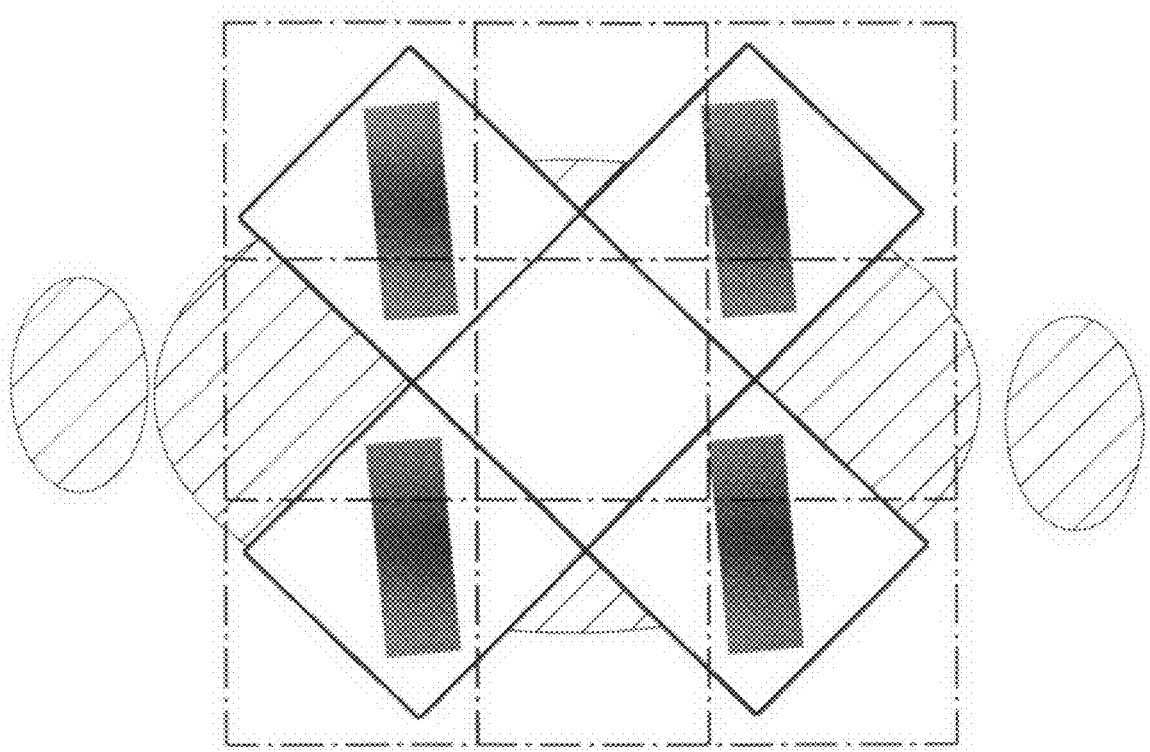
FIG. 5 shows for the slab excitation and spin dephasing patterns of FIGS. 3 and 4, the image encoding matrix is shown to be aligned at 45 degrees to each slab.
FIG. 6 shows for the 3D dual slab excitation scheme of FIGS. 3 through 5, the phase encoding grid is represented. During each TR interval, the signal physically only originates from the excitation slab associated with that TR (slab #1 or slab #2).

With reference to FIG. 4, the alternating orthogonal excitation slabs and gradient combination produce the dark signal regions indicated in FIG. 4. In FIG. 5, one way in which the 3D data could be encoded to take advantage of this partial signal suppression pattern is indicated. In this case, data are to be acquired in a square Cartesian grid, and fully sampled to represent the central region that encompasses most the target region (in this case it intersects with it in an octagonal manner). By encoding data fully for this region, data from the surrounding regions of excited signal will fold over onto the central square. FIG. 5 shows for the slab excitation and spin dephasing patterns of FIGS. 3 and 4, the image encoding matrix is shown to be aligned at 45 degrees to each slab. This is controlled by the imaging gradients that are applied. In this scheme, by encoding the central region, signal from the 8 outer regions will fold over the central region. However, the position of dark signal regions will be distributed over the whole central region, and further the strength of signal overlap will depend on the relative position of the receiver coil elements. Thus, in this scheme, the suppressed signal is widely distributed over the target region. In the case illustrated in FIG. 5, the central target region matches the outer region in shape and dimensions (however, this is not a constraint). By encoding the central region at 45 degrees from the two excitation slabs, the pattern of low signal from each of the outer regions will overlap the central region such that the low region signals do not necessarily overlap with each other, thus distributing the regions of low signal over a wider region than half of the target region of interest. These outer regions can be removed by several methods, including the step of parallel imaging. The advantage being that the necessity to remove an already partially suppressed signal improves the fidelity of representing the central target region.

A possible manner in which data are sampled in this case are illustrated in FIG. 6. During each excitation TR period, data are acquired either from slab #1 or slab #2. FIG. 6 shows for the 3D dual slab excitation scheme of FIGS. 3 through 5, the phase encoding grid is represented. During each TR interval, the signal physically only originates from the excitation slab associated with that TR (slab #1 or slab #2). For TR periods where only slab #1 is excited, phase encoding is applied in a factor of 2 sparse manner along each phase encoding direction (represented by "O"s) while for TR periods where only slab #2 is excited, phase encoding is applied in an interleaved sparse factor of 2 manner along each phase encoding direction (represented by "X"s). In this way, when considering the "O" data set, the central region is folded over on itself, and folded over signal from the slab #1 region only is present, in a predictable manner. Similarly for the "X" data set, signal is folded over for the central region and only slab #2 data. Thus, when considering the "O" and "X" data combined, the central region is not folded over, and the outer regions are folded over in an interleaved manner, but only either from slab #1 or slab #2 for any given pixel. Thus, the energy of the folded over signal is evenly distributed between the two slabs and is of no greater an intensity than if only one slab were excited. The advantage in the ERASER case being the degree of signal suppression achieved for the outer regions. In FIG. 6, the "O"s represent data acquired for slab #1, and the "X"s represent data acquired for slab #2. When the set of "O"s and "X"s are combined, the central region is fully resolved. However, the fold over regions in this combined data derive from the outer regions of slabs 1 and 2. By sampling the data in this structured order, the outer signal from slab 1 only folds over onto half of the pixels of the central region, and similarly the outer signal from slab 2 only folds over on to the other half of the central region pixels. In this manner, while the fold over signal originates from two slabs, the energy of the fold over signal only affects half the target pixels. Thus, despite exciting 2 slabs, even if no outer volume signal suppression were achieved, the fold over intensity is not greater than that of a single slab. However, in the case of ERASER, outer region signal suppression is achieved. In this example, the encoding required is equivalent to encoding the central target region as if it were isolated from all other signal sources.

Figure 7:
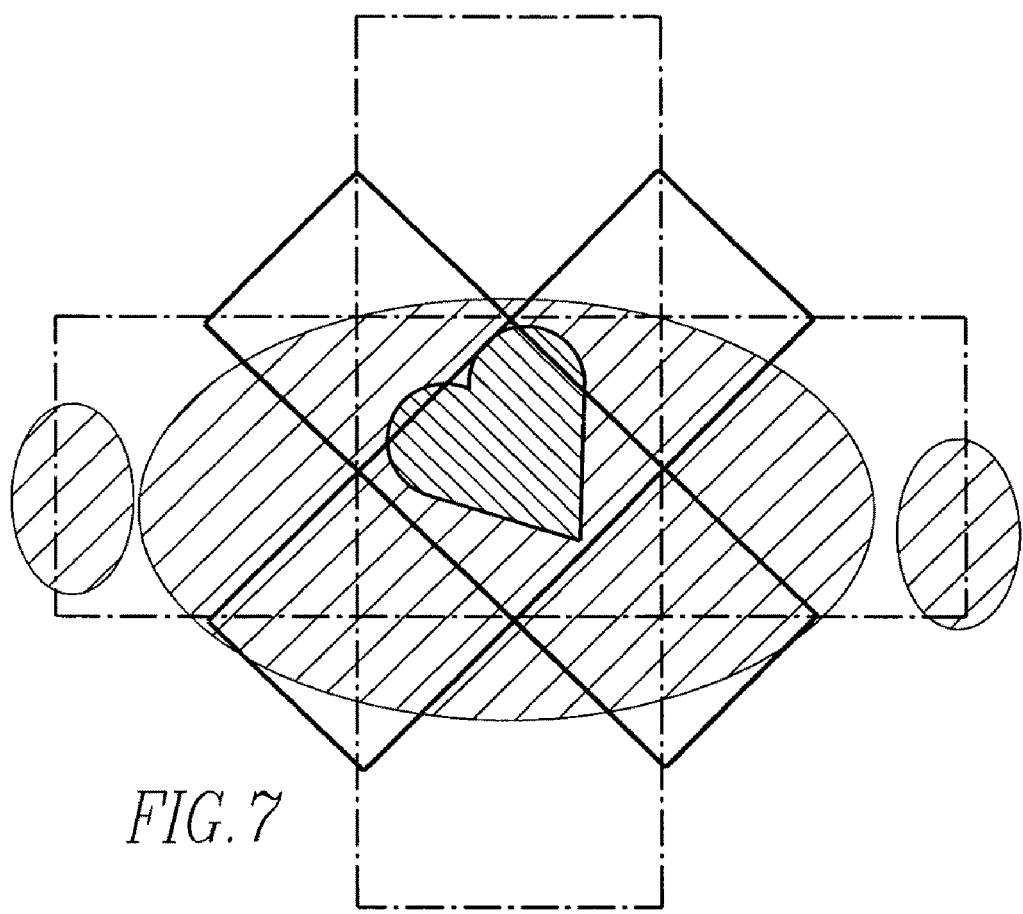
FIG. 7 shows when the acquisition grid has a certain geometric relation to the acquisition grid, it is possible to image the intersecting region of the two slabs without fold over signal from the outer regions.

A second manner of acquiring the inner volume is illustrated in FIG. 7. In this special case, each side of the encoding grid is arranged to be the square root of 2 larger than the intersecting square region. In this case, the fully encoded central region takes twice as many points as the original target region, but the overlapping signal regions fit completely into the triangular corner pieces indicated in FIG. 7, leaving the central square region unencumbered with folded over signal. This aspect can be used in conjunction with outer region signal suppression aspect of ERASER. FIG. 7 shows when the acquisition grid has a certain geometric relation to the acquisition grid, it is possible to image the intersecting region of the two slabs without fold over signal from the outer regions. In this case, the acquisition grid has a target region which has each side set at the square root of 2 times the original target region, and which is also oriented at 45 degrees to the selection slabs. In this case the overlap regions fit into the triangular corners of the larger acquired target region. The cost function for this mode is that the acquisition time is twice that of the original (i.e. smaller) targeted region.

Figure 8:
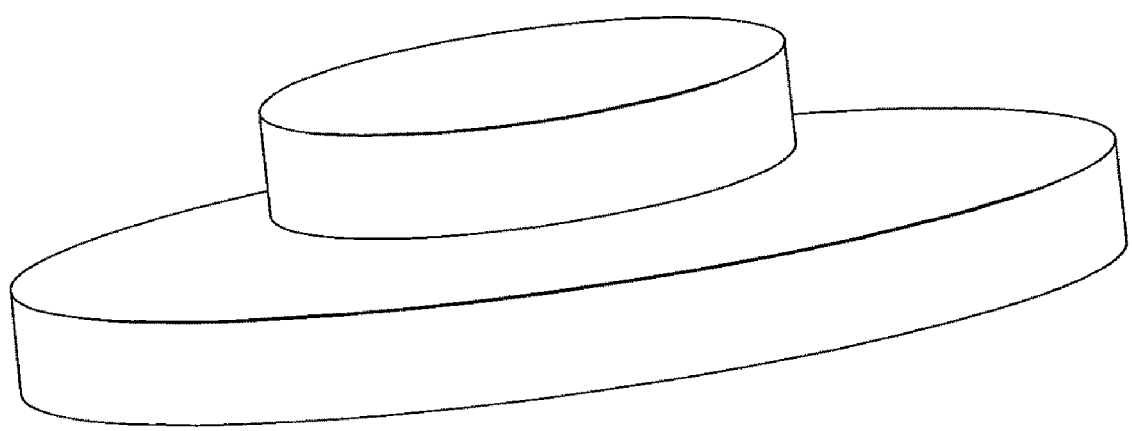
FIG. 8 shows an example of the ideal inhomogeneity pattern that can be approximated using the higher order shim coils.

A second method of bringing about the controlled field inhomogeneity conditions for ERASER is to use the higher order shim coils that are present on most MRI 10 systems. These coils are typically not adjusted during the scan, but can potentially be set to produce an approximately elevated (or depressed) magnetic field over the central region compared to an outer region (FIG. 8). In this case, the pre-programmed field distortion shape could be activated by adjusting the current levels to the multiplicity of shim coils. The required change of field between the inner and outer regions only has to be of a very small magnitude, which is typically well within the adjustment range of typical shim coils. In this manner, the constantly applied field distortion can be arranged to almost completely suppress signal from outer body regions. FIG. 8 shows an example of the ideal inhomogeneity pattern that can be approximated using the higher order shim coils. In the central region, the field is slightly elevated, whereas in the periphery the field is elevated to a lesser extent. By making the central field conditions to be the "on resonance" conditions of the scan, the outer regions are necessarily off resonance. During the 2TR evolution period for the outer regions, the off resonance conditions are designed to cause the spins to be 90 degrees off from the central spins, and will thus not rephase by application of the RF pulses. Since the net phase evolution required to accomplish this is very small, the deformation of the field only has to be very slight. Thus, the deformation of the field required is well within the range that is capable for most shim systems.

2D Inner Volume Imaging

Figure 9:
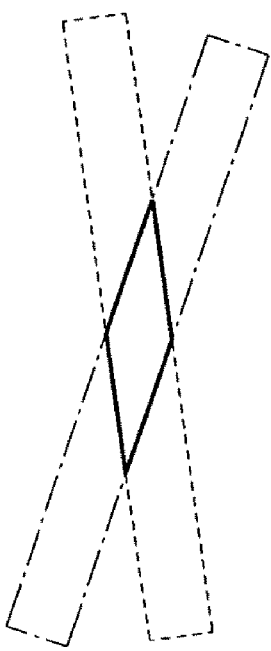
FIG. 9 shows a 2D slice implementation of ERASER.
Figure 10:
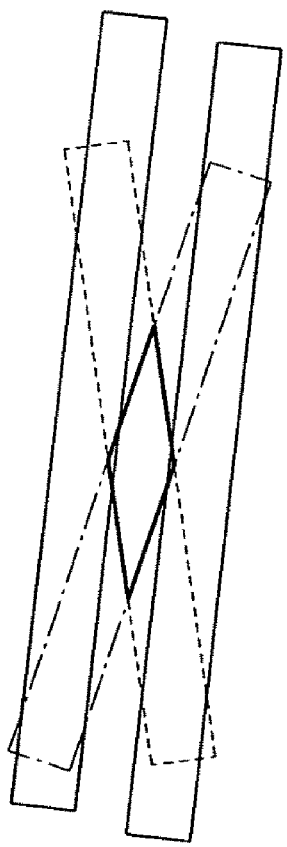
FIG. 10 shows for the 2D version of ERASER illustrated in FIG. 9, the direction of the field inhomogeneity/field offset it arranged to be in the direction perpendicular to the mean orientation of the slices.

In the case of 2D inner volume imaging, it is generally required to suppress signal from the high signal surface regions that are physically close to the receiver coil elements. In the case of cardiac imaging, these include the chest wall and the patient's back wall. In this case, two overlapping slices can be applied, tilted in the slice direction relative to each other, as illustrated in FIG. 9. In this case, a relatively strong inhomogeneity gradient could be applied perpendicular to the mean slice direction to result in relatively narrow signal-loss bands immediately on either side of the central overlapping region, as shown in FIG. 10. The degree of obliquity of the overlapping slices could be adjusted depending on how much surface signal required suppression. FIG. 9 shows a 2D slice implementation of ERASER is indicated. Two slices are seen in side view, and they intersect in a diamond pattern. The intersection shape is therefore a diamond, representing the 1TR spins, and the outer regions are excited at a 2TR interval. FIG. 10 shows for the 2D version of ERASER illustrated in FIG. 9, the direction of the field inhomogeneity/field offset it arranged to be in the direction perpendicular to the mean orientation of the slices. A relatively strong linear gradient produces two thin slabs of signal loss, as indicated by the shaded regions on either side of the target region.

Flow Tagging and Visualization

Figure 11:
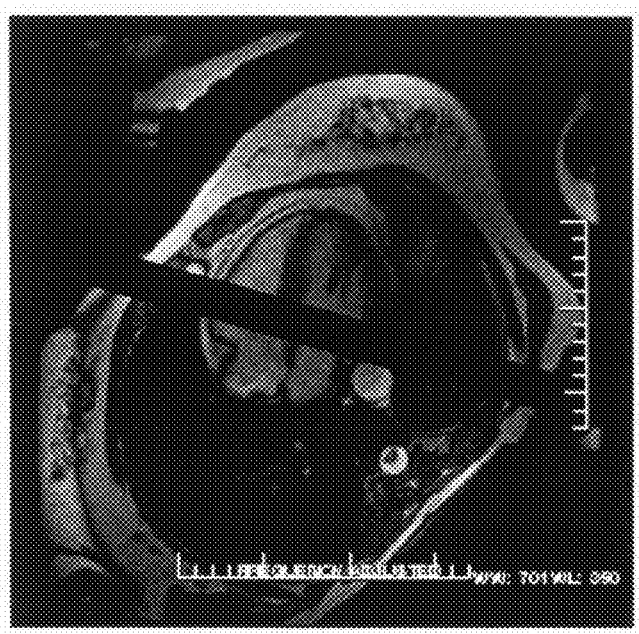
FIG. 11 shows one application of ERASER is to target a relatively thin band of tissue at a user defined position and angle relative to the imaging plane.
Figure 12:
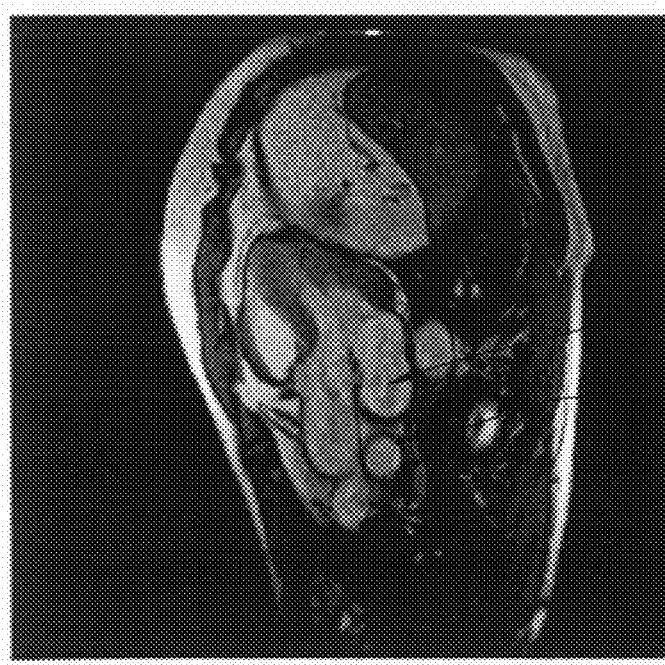
FIG. 12 shows, in this example, blood has flowed through a region of naturally occurring signal loss due to susceptibility changes between different tissue types.
Figure 13:
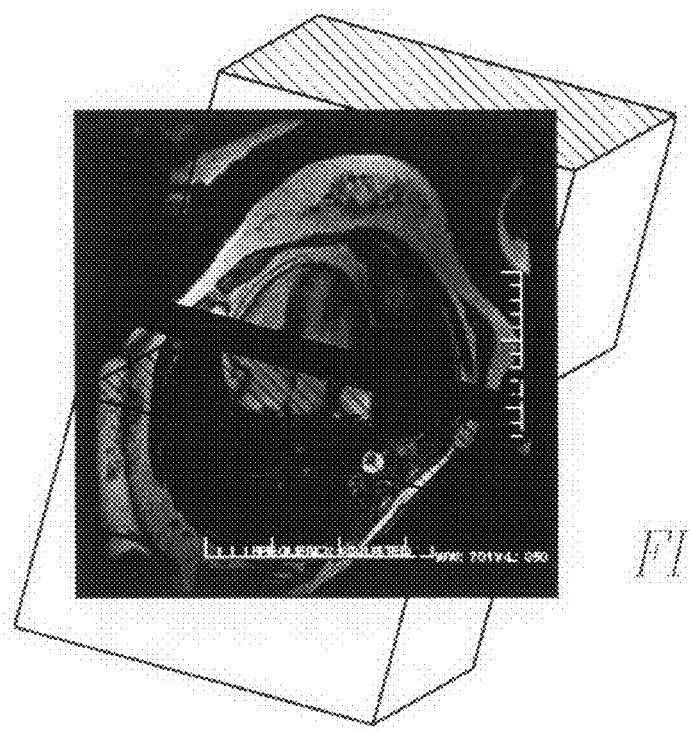
FIG. 13 shows the manner in which a dark band is placed on a 2D slice is illustrated.

The above illustrations of the utility of ERASER have involved inner volume imaging. A second utility area is to apply it to produce a single low signal region over an imaged feature. FIG. 11 shows one application of ERASER is to target a relatively thin band of tissue at a user defined position and angle relative to the imaging plane. In this illustration, ERASER is used to define a band of low signal through the chambers of the heart. Blood that traverses through this band will pick up the low intensity signal condition and when it enters a bright blood region, the flow pattern will be visible as signal loss against the bright blood regions. In the case of FIG. 11, an ERASER band is drawn as overlapping a region of blood flow in the heart. This band could be applied just at one point in the cardiac cycle, or applied repetitively over the cardiac cycle. The utility being that as blood flows through the low signal region, it takes on those properties. FIG. 12 shows, in this example, blood has flown through a region of naturally occurring signal loss due to susceptibility changes between different tissue types. The relatively dark blood shows up against the bright blood of the chamber (this feature is most apparent when viewed as a cine series). FIG. 12 shows where this phenomenon occurs in a natural manner at susceptibility boundaries. The ERASER approach will allow user defined control over which regions are viewed in this manner. The method used to bring about the ERASER conditions in this case is illustrated in FIG. 13. In this case a notched slab selective pulse is applied in a manner orthogonal to the target 2D slice. The notch corresponds to a region in which no signal is excited, and corresponds to the 2TR spins (to be dephased with a suitably applied gradient). In this case, the notched slab is alternated with the 2D slice, such that the majority of the slice is excited at a 1TR interval. Typically, application of the notched slab takes longer than application of the 2D slice selection. In this case, the data present following the notched pulse could be discarded if desired, thus removing the necessity to apply imaging gradients, and thereby easily maintain the TR conditions. FIG. 13 shows the manner in which a dark band is placed on a 2D slice is illustrated. A notched 3D slab (i.e. no signal excitation takes place in the notch) such that the notched region intersects the slice as a line. The notch corresponds to the 2TR region.

Cine Black-Blood Imaging

Figure 14:
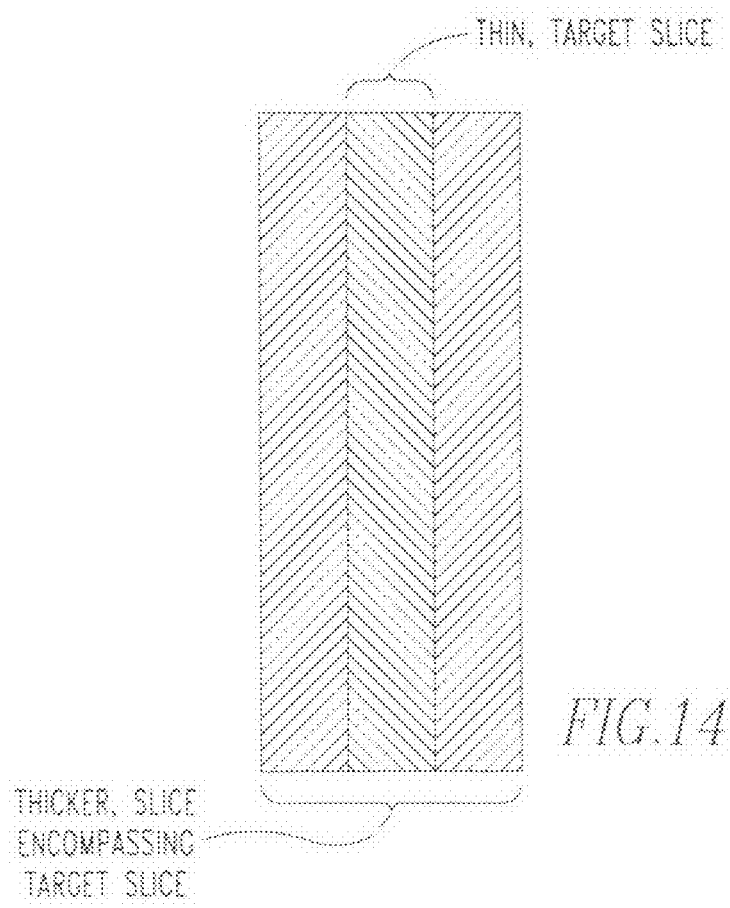
FIG. 14 shows black-blood SSFP cine imaging can be accomplished by making the two slices overlap such that one (target) is embedded within the other thicker slice as illustrated above.
Figure 16:
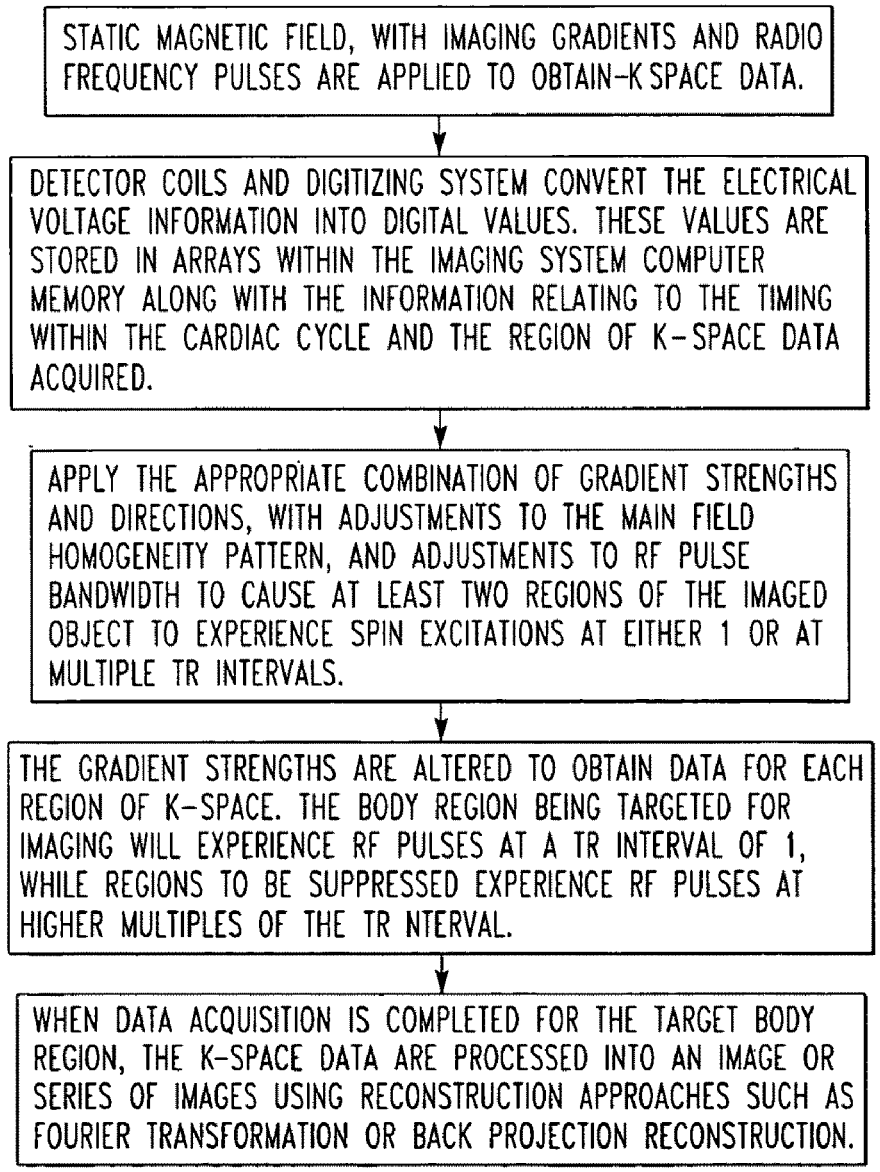
FIG. 16 is a flow chart of the operation of the MRI of the present invention.

Typically, 2D SSFP imaging is associated with bright blood features. In terms of cardiac imaging, the most commonly used sequence to generate "black-blood" images (i.e. images in which blood signal does not contribute) are generated by spin-echo approaches, and traditionally, these have not been applied to generate cine images. By applying an alternating thick and thin slice excitation in conjunction with a dephasing gradient in the manner of ERASER (FIG. 14), the SSFP cine sequence can be made in to a black-blood sequence. Thus, providing the ability to preferentially turn the blood signal on or off adds great clinical potential to the utility of SSFP cine imaging. FIG. 14 shows black-blood SSFP cine imaging can be accomplished by making the two slices overlap such that one (target) is embedded within the other thicker slice as illustrated above. In this case, the relatively strong gradient is applied such that outer (non-overlap) regions of the thick slice (2TR) are completely dephased and contribute zero signal. In this case, during each TR only signal contributing to the target (thin) slice is acquired, and blood that comes in from either side is either reduced in intensity or looses intensity entirely. FIG. 15 is a block diagram of the MRI 10 of the present invention. FIG. 16 is a flow chart of the operation of the MRI 10 of the present invention.

The ERASER acquisition and signal dephasing strategy can be implemented on commercial scanners without requiring additional hardware, but potentially increasing software control over aspects such as the shim gradients. As such, it provides a degree of signal suppression that can be used either in conjunction with conventional inner volume imaging approaches such as parallel imaging, or if the outer volume signal suppression were complete, would allow direct inner volume imaging without the intermediate step of removing folded over signal. The complete suppression of the outer region signal is most likely to be accomplished when using the higher order shim coils. Currently, these are not typically under dynamic control in most scanners, but ERASER does not require that they be rapidly switched (which they are not designed to do), and so would only require an additional control module to allow them to be activated. Also, the level to which they would have to be adjusted is typically well within the adjustment range of these coils. The ability to turn the blood signal on and off at will in SSFP cine images, would be of great diagnostic value. There are current approaches to black-blood SSFP cine imaging, but these require the additional step of applying a separate saturation slice adjacent to the imaged slice, thereby requiring additional preparation time prior to acquiring data. In addition to extending the scan time, extending the TR is known to be a limiting feature in SSFP imaging affecting the maximal field of view and/or the maximal resolution. ERASER overcomes these limitations.

The key features of the ERASER scheme are:
1. Signal of the target region can be acquired following application each RF pulse, leading to greater efficiency compared to MP-SSFP where signal is acquired only after a series of RF pulses are applied. Thus, the rate of acquiring data with ERASER is potentially higher than a comparable implementation using MP-SSFP.
2. The degree of inhomogeneity required in ERASER only has to be at a very low level of perturbation to affect signal suppression, thus, imaging gradients or the higher order shims can be utilized to achieve this without requiring additional hardware to be fitted into the bore of the magnet (the only additional hardware being the controllers 16 to activate the new shim conditions. Importantly, ERASER does not require the shim gradients to be switched during the acquisition, which is significant since these gradients typically can only be slowly adjusted (on the order of 10s of milliseconds).

Although the invention has been described in detail in the foregoing embodiments for the purpose of illustration, it is to be understood that such detail is solely for that purpose and that variations can be made therein by those skilled in the art without departing from the spirit and scope of the invention except as it may be described by the following claims.

The invention claimed is:

1. A steady-state-free-precession (SSFP) magnetic resonance imaging (MRI) comprising:
   imaging coils;
   receiving coils; and
   a controller configured to cause the imaging coils to produce RF pulses at every repetition time so different parts of a patient receive excitation by RF pulses at different rates and k space data are acquired at each repetition time by the receiving coils to form images of the patient, wherein spins that are targeted to be imaged by the imaging coils are excited by an RF pulse at an interval of one repetition time, and wherein spins that are to be suppressed are excited at an interval of at least two repetition times.

2. The MRI as described in claim 1 wherein the controller is configured to cause the imaging coils to apply at least two spatially separate RF pulses to the patient.

3. The MRI as described in claim 2 wherein where two spatially selective regions intersect, the spins receive successive excitations at an interval of one repetition time, and wherein spatial regions that do not intersect receive RF pulses at an interval of two repetition times.

4. The MRI as described in claim 3 wherein the controller is configured to cause the imaging coils to introduce a targeted inhomogeneity of a magnetic field such that spins that experience a two repetition time excitation dephase by close to 90° do not contribute to the signal received by the receiving coils for the data, while spins that experience a one repetition time interval experience a lesser dephase angle and contribute a signal to the receiving coils for data.

5. The MRI as described in claim 4 wherein over an extended time of two repetition times, the field inhomogeneity sufficiently dephase spins such that the dephase spins do not contribute to the signal, wherein over a one repetition time interval, the field inhomogeneity does not substantially dephase the spins, and wherein the spins in the one repetition time interval contribute to subsequent signals.

6. A method for a steady-state-free-precession (SSFP) magnetic resonance imaging (MRI) comprising:
 causing, with a controller, imaging coils to produce RF pulses at every repetition time so different parts of a patient are receiving excitation by RF pulses at different rates, wherein causing the imaging coils to produce RF pulses comprises:
  exciting by an RF pulse at an interval of one repetition time from the imaging coils, spins that are targeted to be imaged by the imaging coils, and
  exciting by an RF pulse at an interval of at least two repetition times, spins that are to be suppressed;
 acquiring k space data at each repetition time by receiving coils; and
 forming images of the patient with the k space data.

7. The method as described in claim 6, further including: causing, by the controller, the imaging coils to apply at least two spatially separate RF pulses to the patient.

8. The method as described in claim 7 wherein:
 where two spatially selective regions intersect, the spins receive successive excitations at an interval of one repetition time, and
 where two spatially selective regions do not intersect the spins receive RF pulses at an interval of two repetition times.

9. The method as described in claim 8, further including:
 causing, by the controller, the imaging coils to introduce a targeted inhomogeneity of a magnetic field such that spins that experience a two repetition time excitation dephase by close to 90° do not contribute to a signal received by the receiving coils for the data, while spins that experience a one repetition time interval experience a lesser dephase angle and contribute a signal to the receiving coils for data.

10. The method as described in claim 9 wherein over an extended time of two repetition times, the field inhomogeneity sufficiently dephases spins such that the dephased spins do not contribute to the signal, while over a one repetition time interval, the field inhomogeneity does not substantially dephase the spins and the spins in the one repetition time interval contribute to subsequent signals.

11. A method for a steady-state-free-precession (SSFP) magnetic resonance imaging (MRI) comprising:
 causing with a controller imaging coils to produce RF pulses at every repetition time so different parts of a patient receive excitation by RF pulses at different rates and a targeted body region is remote from the surface of the patient, wherein causing the imaging coils to produce RF pulses comprises:
  exciting by an RF pulse at an interval of one repetition time from the imaging coils, spins that are targeted to be imaged by the imaging coils, and
  exciting by an RF pulse at an interval of at least two repetition times, spins that are to be suppressed;
 acquiring k space data at each repetition time by receiving coils; and
 forming images of the patient with the k space data.

12. A method for a steady-state-free-precession (SSFP) magnetic resonance imaging (MRI) comprising:
 causing with a controller imaging coils to produce RF pulses at every repetition time so different parts of a patient receive excitation by RF pulses at different rates and a targeted plane of the body of the patient is remote from the surface of the patient, wherein causing the imaging coils to produce RF pulses comprises:
  exciting by an RF pulse at an interval of one repetition time from the imaging coils, spins that are targeted to be imaged by the imaging coils, and
  exciting by an RF pulse at an interval of at least two repetition times, spins that are to be suppressed;
 acquiring k space data at each repetition time by receiving coils; and
 forming images of the patient with the k space data.

13. A method for a steady-state-free-precession (SSFP) magnetic resonance imaging (MRI) comprising:
 causing with a controller imaging coils to produce RF pulses at every repetition time so different parts of a patient receive excitation by RF pulses at different rates and a region of flow is targeted in the patient, wherein causing the imaging coils to produce RF pulses comprises:
  exciting by an RF pulse at an interval of one repetition time from the imaging coils, spins that are targeted to be imaged by the imaging coils, and
  exciting by an RF pulse at an interval of at least two repetition times, spins that are to be suppressed;
 acquiring k space data at each repetition time by receiving coils; and
 forming images of the patient with the k space data.

14. A method for a steady-state-free-precession (SSFP) magnetic resonance imaging (MRI) comprising:
 causing with a controller imaging coils to produce RF pulses at every repetition time so different parts of a patient receive excitation by RF pulses at different rates and any contribution from moving blood is removed, wherein causing the imaging coils to produce RF pulses comprises:
  exciting by an RF pulse at an interval of one repetition time from the imaging coils, spins that are targeted to be imaged by the imaging coils, and
  exciting by an RF pulse at an interval of at least two repetition times, spins that are to be suppressed;
 acquiring k space data at each repetition time by receiving coils; and
 forming images of the patient with the k space data.

* * * * *